United States Patent
Kawai et al.

(10) Patent No.: US 8,085,381 B2
(45) Date of Patent: *Dec. 27, 2011

(54) CLEANUP METHOD FOR OPTICS IN IMMERSION LITHOGRAPHY USING SONIC DEVICE

(75) Inventors: Hidemi Kawai, Palo Alto, CA (US); Douglas C Watson, Campbell, CA (US); W Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/704,241

(22) Filed: Feb. 9, 2007

(65) Prior Publication Data

US 2007/0132975 A1 Jun. 14, 2007

Related U.S. Application Data

(60) Division of application No. 11/237,651, filed on Sep. 29, 2005, now Pat. No. 7,522,259, which is a continuation of application No. PCT/US2004/010309, filed on Apr. 2, 2004.

(60) Provisional application No. 60/462,556, filed on Apr. 11, 2003, provisional application No. 60/482,913, filed on Jun. 27, 2003.

(51) Int. Cl.
*G03B 27/52* (2006.01)
(52) U.S. Cl. .......................................... 355/30
(58) Field of Classification Search ............. 355/30, 355/53, 67; 359/665; 356/509
See application file for complete search history.

(56) References Cited

U.S. PATENT DOCUMENTS

| | | |
|---|---|---|
| 3,139,101 A | 6/1964 | Wyczalek et al. |
| 3,648,587 A | 3/1972 | Stevens |
| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,780,747 A | 10/1988 | Suzuki et al. |
| RE32,795 E | 12/1988 | Matsuura et al. |
| 4,825,453 A | 4/1989 | Kembo et al. |
| 5,368,649 A | 11/1994 | Tsukazaki |
| 5,493,403 A | 2/1996 | Nishi |
| 5,528,118 A | 6/1996 | Lee |

(Continued)

FOREIGN PATENT DOCUMENTS

CN 1867865 A 11/2006
(Continued)

OTHER PUBLICATIONS

M. Switkes, R.R. Kunz, R.F. Sinta, M. Rothschild; P.m. Gallagher-Wetmore, V.J. Krukonis and K. Williams, Immersion Liquids for Lithography in the Deep Ultraviolet, 2003, SPIE, Optical Microlithography XVI, vol. 5040, pp. 690-699.

(Continued)

*Primary Examiner* — Peter B Kim
*Assistant Examiner* — Chia-how Michael Liu
(74) *Attorney, Agent, or Firm* — Oliff & Berridge, PLC

(57) ABSTRACT

A megasonic immersion lithography exposure apparatus includes an optical transfer chamber for containing an exposure liquid, at least one megasonic plate operably engaging said optical transfer chamber for propagating sonic waves through the exposure liquid, and an optical system provided adjacent to said optical transfer chamber for projecting light through a mask and said exposure liquid and onto a wafer.

17 Claims, 6 Drawing Sheets

U.S. PATENT DOCUMENTS

| | | | |
|---|---|---|---|
| 5,610,683 A * | 3/1997 | Takahashi | 355/53 |
| 5,623,853 A | 4/1997 | Novak et al. | |
| 5,646,413 A | 7/1997 | Nishi | |
| 5,657,129 A | 8/1997 | Nishi | |
| 5,715,039 A | 2/1998 | Fukuda et al. | |
| 5,744,924 A | 4/1998 | Lee | |
| 5,774,575 A | 6/1998 | Tanaka et al. | |
| 5,815,246 A | 9/1998 | Sperling et al. | |
| 5,825,043 A | 10/1998 | Suwa | |
| 5,844,247 A | 12/1998 | Nishi | |
| 5,874,820 A | 2/1999 | Lee | |
| 5,942,871 A | 8/1999 | Lee | |
| 5,969,441 A | 10/1999 | Loopstra et al. | |
| 5,980,647 A * | 11/1999 | Buker et al. | 134/33 |
| 5,982,128 A | 11/1999 | Lee | |
| 5,995,234 A | 11/1999 | Nishi | |
| 6,008,500 A | 12/1999 | Lee | |
| 6,020,710 A | 2/2000 | Lee | |
| 6,033,478 A | 3/2000 | Kholodenko | |
| 6,049,186 A | 4/2000 | Lee | |
| 6,051,843 A | 4/2000 | Nishi | |
| 6,087,797 A | 7/2000 | Lee | |
| 6,150,787 A | 11/2000 | Lee | |
| 6,151,105 A | 11/2000 | Lee | |
| 6,175,404 B1 | 1/2001 | Lee | |
| 6,178,974 B1 * | 1/2001 | Kobayashi et al. | 134/1.3 |
| 6,188,195 B1 | 2/2001 | Lee | |
| 6,191,429 B1 | 2/2001 | Suwa | |
| 6,195,154 B1 | 2/2001 | Imai | |
| 6,208,407 B1 | 3/2001 | Loopstra | |
| 6,246,202 B1 | 6/2001 | Lee | |
| 6,262,796 B1 | 7/2001 | Loopstra et al. | |
| 6,268,904 B1 | 7/2001 | Mori et al. | |
| 6,271,640 B1 | 8/2001 | Lee | |
| 6,279,881 B1 | 8/2001 | Nishi | |
| 6,281,654 B1 | 8/2001 | Lee | |
| 6,307,620 B1 | 10/2001 | Takabayashi et al. | |
| 6,316,901 B2 | 11/2001 | Lee | |
| 6,327,025 B1 | 12/2001 | Imai | |
| 6,341,007 B1 | 1/2002 | Nishi et al. | |
| 6,400,441 B1 | 6/2002 | Nishi et al. | |
| 6,459,472 B1 | 10/2002 | De Jager et al. | |
| 6,459,672 B1 | 10/2002 | Asoma | |
| 6,466,365 B1 | 10/2002 | Maier et al. | |
| 6,496,257 B1 | 12/2002 | Taniguchi et al. | |
| 6,498,352 B1 | 12/2002 | Nishi | |
| 6,549,269 B1 | 4/2003 | Nishi et al. | |
| 6,590,634 B1 | 7/2003 | Nishi et al. | |
| 6,683,433 B2 | 1/2004 | Lee | |
| 6,747,732 B1 | 6/2004 | Lee | |
| 6,778,257 B2 | 8/2004 | Bleeker et al. | |
| 6,781,670 B2 | 8/2004 | Krautschik | |
| 6,788,477 B2 | 9/2004 | Lin | |
| 6,798,491 B2 | 9/2004 | Nishi et al. | |
| 6,841,965 B2 | 1/2005 | Lee | |
| 6,844,206 B1 | 1/2005 | Phan et al. | |
| 6,853,794 B2 | 2/2005 | Lu et al. | |
| 6,878,916 B2 | 4/2005 | Schuster | |
| 6,891,596 B2 | 5/2005 | Rostalski et al. | |
| 6,891,683 B2 | 5/2005 | Schuster | |
| 6,914,665 B2 | 7/2005 | Ishikawa | |
| 6,927,840 B2 | 8/2005 | Lee | |
| 6,989,647 B1 | 1/2006 | Lee | |
| 7,029,832 B2 | 4/2006 | Rolland et al. | |
| 7,061,573 B2 | 6/2006 | Tsukamoto | |
| 7,061,575 B2 | 6/2006 | Taniguchi et al. | |
| 7,070,915 B2 | 7/2006 | Ho et al. | |
| 7,075,616 B2 | 7/2006 | Derksen et al. | |
| 7,092,069 B2 | 8/2006 | Schuster | |
| 7,145,641 B2 | 12/2006 | Phillips et al. | |
| 7,154,676 B2 | 12/2006 | Schuster | |
| 7,177,008 B2 | 2/2007 | Nishi et al. | |
| 7,190,527 B2 | 3/2007 | Rostalski et al. | |
| 7,199,858 B2 | 4/2007 | Lof et al. | |
| 7,203,008 B2 | 4/2007 | Schuster | |
| 7,224,427 B2 | 5/2007 | Chang et al. | |
| 7,256,869 B2 | 8/2007 | Nishi | |
| 7,262,422 B2 | 8/2007 | Subramanian et al. | |
| 7,312,847 B2 | 12/2007 | Rostalski et al. | |
| 7,317,504 B2 | 1/2008 | De Smit et al. | |
| RE40,043 E | 2/2008 | Kwan et al. | |
| 7,339,743 B2 | 3/2008 | Schuster | |
| 7,365,513 B1 | 4/2008 | Lee | |
| 7,379,158 B2 | 5/2008 | Mizutani et al. | |
| 7,382,540 B2 | 6/2008 | Rostalski et al. | |
| 7,388,649 B2 | 6/2008 | Kobayashi et al. | |
| 7,433,015 B2 | 10/2008 | Mulkens et al. | |
| 7,433,019 B2 | 10/2008 | Kiuchi et al. | |
| 7,436,486 B2 | 10/2008 | Hirukawa | |
| 7,436,487 B2 | 10/2008 | Mizutani et al. | |
| 7,442,908 B2 | 10/2008 | Schuster | |
| 7,446,851 B2 | 11/2008 | Hirukawa | |
| 7,460,207 B2 | 12/2008 | Mizutani et al. | |
| 7,483,117 B2 | 1/2009 | Hirukawa | |
| 7,495,840 B2 | 2/2009 | Schuster | |
| 7,505,111 B2 | 3/2009 | Hirukawa et al. | |
| 7,522,259 B2 | 4/2009 | Hazelton et al. | |
| 7,589,820 B2 | 9/2009 | Nei et al. | |
| 7,589,821 B2 | 9/2009 | Hirukawa | |
| 7,639,343 B2 | 12/2009 | Hirukawa | |
| 2001/0015021 A1 | 8/2001 | Gommori et al. | |
| 2001/0019250 A1 | 9/2001 | Lee | |
| 2001/0019399 A1 | 9/2001 | Hagiwara | |
| 2001/0030522 A1 | 10/2001 | Lee | |
| 2001/0043320 A1 | 11/2001 | Kato et al. | |
| 2002/0017889 A1 | 2/2002 | Lee | |
| 2002/0041377 A1 | 4/2002 | Hagiwara et al. | |
| 2002/0061469 A1 | 5/2002 | Tanaka | |
| 2002/0163629 A1 | 11/2002 | Switkes et al. | |
| 2003/0011763 A1 | 1/2003 | Taniguchi et al. | |
| 2003/0030916 A1 | 2/2003 | Suenaga | |
| 2003/0066975 A1 | 4/2003 | Okada | |
| 2003/0157538 A1 | 8/2003 | Krull et al. | |
| 2003/0174408 A1 | 9/2003 | Rostalski et al. | |
| 2004/0000627 A1 | 1/2004 | Schuster | |
| 2004/0004757 A1 | 1/2004 | Schuster | |
| 2004/0021061 A1 | 2/2004 | Bijkerk | |
| 2004/0032575 A1 | 2/2004 | Nishi et al. | |
| 2004/0041377 A1 | 3/2004 | Kumakiri et al. | |
| 2004/0075895 A1 | 4/2004 | Lin | |
| 2004/0090606 A1 | 5/2004 | Ishikawa | |
| 2004/0095085 A1 | 5/2004 | Lee | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0120051 A1 | 6/2004 | Schuster | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0233407 A1 | 11/2004 | Nishi et al. | |
| 2004/0238005 A1 | 12/2004 | Takayama | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0002009 A1 | 1/2005 | Lee | |
| 2005/0007569 A1 | 1/2005 | Streefkerk et al. | |
| 2005/0018208 A1 | 1/2005 | Levinson | |
| 2005/0024609 A1 | 2/2005 | De Smit et al. | |
| 2005/0025108 A1 | 2/2005 | Dillinger et al. | |
| 2005/0028314 A1 | 2/2005 | Hickman et al. | |
| 2005/0030506 A1 | 2/2005 | Schuster | |
| 2005/0036121 A1 | 2/2005 | Hoogendam et al. | |

| Publication | Date | Inventor |
|---|---|---|
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0078286 A1 | 4/2005 | Dierichs et al. |
| 2005/0084794 A1 | 4/2005 | Meagley et al. |
| 2005/0094115 A1 | 5/2005 | Taniguchi et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0111108 A1 | 5/2005 | Schuster |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0178944 A1 | 8/2005 | Schuster |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0231813 A1 | 10/2005 | Rostalski et al. |
| 2005/0231814 A1 | 10/2005 | Rostalski et al. |
| 2005/0237501 A1 | 10/2005 | Furukawa et al. |
| 2005/0243292 A1 | 11/2005 | Baselmans et al. |
| 2005/0243293 A1 | 11/2005 | Hara et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264774 A1 | 12/2005 | Mizutani et al. |
| 2005/0270505 A1 | 12/2005 | Smith |
| 2006/0023182 A1 | 2/2006 | Novak et al. |
| 2006/0023185 A1 | 2/2006 | Hazelton et al. |
| 2006/0028626 A1 | 2/2006 | Chang et al. |
| 2006/0028628 A1 | 2/2006 | Lin et al. |
| 2006/0050257 A1 | 3/2006 | Honda |
| 2006/0077367 A1 | 4/2006 | Kobayashi et al. |
| 2006/0082744 A1 | 4/2006 | Hirukawa |
| 2006/0098179 A1 | 5/2006 | Hirukawa |
| 2006/0119813 A1 | 6/2006 | Hultermans et al. |
| 2006/0119816 A1 | 6/2006 | Baselmans et al. |
| 2006/0119820 A1 | 6/2006 | Hirukawa |
| 2006/0126043 A1 | 6/2006 | Mizutani et al. |
| 2006/0126044 A1 | 6/2006 | Mizutani et al. |
| 2006/0132731 A1 | 6/2006 | Jansen et al. |
| 2006/0132738 A1 | 6/2006 | Hirukawa |
| 2006/0152696 A1 | 7/2006 | Boogaard et al. |
| 2006/0154183 A1 | 7/2006 | Magome |
| 2006/0164615 A1 | 7/2006 | Hirukawa |
| 2006/0209278 A1 | 9/2006 | Kiuchi et al. |
| 2006/0232757 A1 | 10/2006 | Tani et al. |
| 2006/0238730 A1 | 10/2006 | Nei et al. |
| 2007/0019301 A1 | 1/2007 | Schuster |
| 2007/0064210 A1 | 3/2007 | Kobayashi et al. |
| 2007/0076183 A1 | 4/2007 | Hara et al. |
| 2007/0109515 A1 | 5/2007 | Nishi |
| 2007/0115447 A1 | 5/2007 | Hirukawa et al. |
| 2007/0115448 A1 | 5/2007 | Hirukawa et al. |
| 2007/0127001 A1 | 6/2007 | Van Der Hoeven |
| 2007/0132968 A1 | 6/2007 | Kobayashi et al. |
| 2007/0159610 A1 | 7/2007 | Shiraishi |
| 2007/0171390 A1 | 7/2007 | Hazelton et al. |
| 2007/0171391 A1 | 7/2007 | Magome et al. |
| 2007/0188880 A1 | 8/2007 | Schuster |
| 2007/0242247 A1 | 10/2007 | Shiraishi |
| 2007/0247600 A1 | 10/2007 | Kobayashi et al. |
| 2007/0247601 A1 | 10/2007 | Hazelton et al. |
| 2007/0247722 A1 | 10/2007 | Rostalski et al. |
| 2007/0252960 A1 | 11/2007 | Kida |
| 2007/0258064 A1 | 11/2007 | Hirukawa |
| 2007/0263196 A1 | 11/2007 | Hirukawa et al. |
| 2008/0018867 A1 | 1/2008 | Fujiwara et al. |
| 2008/0030695 A1 | 2/2008 | Kobayashi et al. |
| 2008/0030696 A1 | 2/2008 | Kobayashi et al. |
| 2008/0151203 A1 | 6/2008 | Hirukawa et al. |
| 2008/0180053 A1 | 7/2008 | Lee |
| 2008/0225249 A1 | 9/2008 | Kobayashi et al. |
| 2008/0225250 A1 | 9/2008 | Kobayashi et al. |
| 2008/0231825 A1 | 9/2008 | Kobayashi et al. |
| 2008/0309896 A1 | 12/2008 | Hirukawa |
| 2009/0002660 A1 | 1/2009 | Kiuchi |
| 2009/0015807 A1 | 1/2009 | Hirukawa et al. |
| 2009/0021707 A1 | 1/2009 | Mulkens et al. |
| 2009/0027636 A1 | 1/2009 | Leenders et al. |
| 2009/0104568 A1 | 4/2009 | Hirukawa |
| 2009/0128793 A1 | 5/2009 | Hara et al. |
| 2009/0180089 A1 | 7/2009 | Nei et al. |

FOREIGN PATENT DOCUMENTS

| | | |
|---|---|---|
| DE | 221 563 A1 | 4/1985 |
| DE | 224 448 A1 | 7/1985 |
| EP | 0 023 231 A1 | 2/1981 |
| EP | 0 605 103 A1 | 7/1994 |
| EP | 0 834 773 A2 | 4/1998 |
| EP | 0 874 283 A2 | 10/1998 |
| EP | 1 329 773 A2 | 7/2003 |
| EP | 1 420 298 A2 | 5/2004 |
| EP | 1 420 299 A2 | 5/2004 |
| EP | 1 429 188 A2 | 6/2004 |
| EP | 1 486 827 A2 | 12/2004 |
| EP | 1 522 894 A2 | 4/2005 |
| EP | 1 524 558 A1 | 4/2005 |
| EP | 1 571 695 A1 | 9/2005 |
| EP | 1 571 697 A1 | 9/2005 |
| EP | 1 571 699 A1 | 9/2005 |
| EP | 1 624 481 A1 | 2/2006 |
| EP | 1 628 161 A2 | 2/2006 |
| EP | 1 628 329 A1 | 2/2006 |
| EP | 1 628 330 A1 | 2/2006 |
| EP | 1 632 991 A2 | 3/2006 |
| EP | 1 667 211 A1 | 6/2006 |
| EP | 1 699 073 A1 | 9/2006 |
| EP | 1 727 188 A1 | 11/2006 |
| EP | 1 821 337 A1 | 8/2007 |
| JP | A-57-117238 | 7/1982 |
| JP | A-57-153433 | 9/1982 |
| JP | A-58-202448 | 11/1983 |
| JP | A-59-19912 | 2/1984 |
| JP | A-62-65326 | 3/1987 |
| JP | A-62-183522 | 8/1987 |
| JP | A-63-73628 | 4/1988 |
| JP | A-63-157419 | 6/1988 |
| JP | A-04-065603 | 3/1992 |
| JP | A-4-065603 | 3/1992 |
| JP | A-4-305915 | 10/1992 |
| JP | A-4-305917 | 10/1992 |
| JP | A-5-62877 | 3/1993 |
| JP | A-5-304072 | 11/1993 |
| JP | A-6-053120 | 2/1994 |

| | | |
|---|---|---|
| JP | A-6-53120 | 2/1994 |
| JP | A-6-124873 | 5/1994 |
| JP | A-6-168866 | 6/1994 |
| JP | A-6-181157 | 6/1994 |
| JP | A-6-188169 | 7/1994 |
| JP | A-7-132262 | 5/1995 |
| JP | A-7-176468 | 7/1995 |
| JP | A-07-176468 | 7/1995 |
| JP | A-7-220990 | 8/1995 |
| JP | A-08-037149 | 2/1996 |
| JP | A-8-037149 | 2/1996 |
| JP | 8-115868 | 5/1996 |
| JP | A-8-115868 | 5/1996 |
| JP | A-8-166475 | 6/1996 |
| JP | A-8-195375 | 7/1996 |
| JP | A-8-316125 | 11/1996 |
| JP | A-8-330224 | 12/1996 |
| JP | A-10-116760 | 5/1998 |
| JP | A-10-154659 | 6/1998 |
| JP | A-10-163099 | 6/1998 |
| JP | A-10-214783 | 8/1998 |
| JP | A-10-255319 | 9/1998 |
| JP | A-10-303114 | 11/1998 |
| JP | A-10-340846 | 12/1998 |
| JP | A-11-16816 | 1/1999 |
| JP | A-11-016816 | 1/1999 |
| JP | 11-176727 * | 2/1999 |
| JP | A-11-135400 | 5/1999 |
| JP | A-11-162831 | 6/1999 |
| JP | A-11-166990 | 6/1999 |
| JP | A-11-176727 | 7/1999 |
| JP | A-11-238680 | 8/1999 |
| JP | A-11-283903 | 10/1999 |
| JP | A-2000-58436 | 2/2000 |
| JP | A-2000-91207 | 3/2000 |
| JP | A-2000-97616 | 4/2000 |
| JP | A-2000-505958 | 5/2000 |
| JP | A-2001-291855 | 10/2001 |
| JP | A-2002-14005 | 1/2002 |
| JP | A-2002-014005 | 1/2002 |
| JP | A-2004-7417 | 1/2004 |
| JP | A-2005-5713 | 1/2005 |
| JP | A-2005-136404 | 2/2005 |
| JP | A-2005-072404 | 3/2005 |
| JP | A-2005-72404 | 3/2005 |
| JP | A-2005-79222 | 3/2005 |
| JP | A-2005-79584 | 3/2005 |
| JP | A-2005-079584 | 3/2005 |
| JP | A-2005-101487 | 4/2005 |
| JP | A-2005-136404 | 5/2005 |
| JP | A-2005-183693 | 7/2005 |
| JP | A-2005-277363 | 10/2005 |
| JP | A-2006-190997 | 7/2006 |
| WO | WO 98/24115 | 6/1998 |
| WO | WO 98/28665 | 7/1998 |
| WO | WO 98/58079 | 12/1998 |
| WO | WO 98/59364 | 12/1998 |
| WO | WO 99/27568 A1 | 6/1999 |
| WO | WO 99/32940 | 7/1999 |
| WO | WO 99/49504 | 9/1999 |
| WO | WO 01/35168 A1 | 5/2001 |
| WO | WO 02/063664 A1 | 8/2002 |
| WO | WO 02/091078 A1 | 11/2002 |
| WO | WO 03/077036 A1 | 9/2003 |
| WO | WO 03/077037 A1 | 9/2003 |
| WO | WO 2004/019128 A2 | 3/2004 |
| WO | WO 2004/051717 A1 | 6/2004 |
| WO | WO 2004/053952 | 6/2004 |
| WO | WO 2004/053953 A1 | 6/2004 |
| WO | WO 2004/053955 A1 | 6/2004 |
| WO | WO 2004/053958 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105107 | 12/2004 |
| WO | WO 2004/105107 AI | 12/2004 |
| WO | WO 2004/107417 A1 | 12/2004 |
| WO | WO 2004/107417 AI | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/006417 A1 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/022615 | 3/2005 |
| WO | WO 2005/022615 A1 | 3/2005 |
| WO | WO 2005/024325 A2 | 3/2005 |
| WO | WO 2005/024517 A2 | 3/2005 |
| WO | WO 2005/031820 A1 | 4/2005 |
| WO | WO 2005/031820 AI | 4/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/076323 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2006/062065 A1 | 6/2006 |

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of Spie vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, :Potential performance and feasibility of immersion lithography, Soichi Owa et al., 33 pages, slides 1-33.
Aug. 6, 2009 Supplementary European Search Report in European Application No. 04 73 4624.
Sep. 14, 2004 International Search Report and Written Opinion in Application No. PCT/JP2004/007417.
Apr. 4, 2007 Supplementary European Search Report in European Application No. 04 75 9103.
Hancock, "Enhance Your Cleaning Process with Ultrasonics", pfonline.com/articles/040003.html, Jan. 21, 2001.
Aug. 27, 2010 Office Action in U.S. Appl. No. 12/379,171.
Sep. 1, 2010 Office Action in U.S. Appl. No. 12/382,162.
Aug. 27, 2010 Office Action in U.S. Appl. No. 12/003,038.
Aug. 27, 2010 Office Action in U.S. Appl. No. 12/382,078.
Aug. 3, 2010 Office Action in Japanese Application No. 2006-274332, with translation.
Aug. 10, 2010 Office Action in Japanese Application No. 2004-151714, with translation.
Aug. 10, 2010 Office Action in Japanese Application No. 2008-164527, with translation.
Aug. 10, 2010 Office Action in Japanese Application No. 2006-274330, with translation.
Aug. 3, 2010 Office Action in Japanese Application No. 2006-514514, with translation.
Aug. 3, 2010 Office Action in U.S. Appl. No. 12/153,357.
Jun. 15, 2010 Notice of Allowance in U.S. Appl. No. 11/808,231.
Jun. 21, 2010 Office Action in U.S. Appl. No. 11/603,078.
Jul. 12, 2010 Notice of Allowance in U.S. Appl. No. 11/767,425.
Mar. 3, 2010 Office Action in U.S. Appl. No. 11/570,219.
Mar. 2, 2010 Office Action in U.S. Appl. No. 11/767,441.
Mar. 2, 2010 Office Action in U.S. Appl. No. 12/134,950.
Apr. 8, 2010 Notice of Allowance in U.S. Appl. No. 11/767,425.
Feb. 19, 2010 Notice of Allowance in U.S. Appl. No. 11/808,231.
Dec. 10, 2009 Office Action in U.S. Appl. No. 11/015,767.
Aug. 21, 2007 European Office Action in European Application No. 04 759 103.7.
Jun. 11, 2008 European Summos to Attend Oral Proceedings in European Application No. 04 759 103.7.
Nov. 21, 2008 European Result of Consultation in European Application No. 04 759 103.7.
Dec. 5, 2008 European Result of Consultation in European Application No. 04 759 103.7.
Jan. 9, 2009 European Rule 71(3) Allowance in European Application No. 04 759 103.7.
Jan. 9, 2009 European Result of Consultation in European Application No. 04 759 103.7.
Feb. 4, 2010 European Search Report in European Application No. 09176909.1.
Feb. 4, 2010 European Search Report in European Application No. 09176910.9.
Feb. 8, 2010 European Search Report in European Application No. 09176911.7.
Feb. 23, 2010 European Search Report in European Applicafon No. 09176913.3.
Mar. 8, 2010 European Search Report in European Application No. 09176912.5.
Mar. 19, 2008 Austrian Invitation to Respond to Written Opinion in Singapore Application No. 200506413-4.
Jan. 21, 2009 Austrian Examination Report in Singapore Application No. 200506413-4.
Mar. 9, 2010 Japanese Office Action in Japanese Application No. 2004-151714, with translation.
Mar. 9, 2010 Japanese Office Action in Japanese Application No. 2006-274330, with translation.
Sep. 20, 2005 International Search Report and Written Opinion in Application No. PCT/JP2005/010412, with translation.
Jun. 9, 2009 Supplementary European Search Report in European Application No. 05749073.2.
Jul. 4, 2008 Chinese Office Action in Chinese Application No. 2005800183590, with translation.
Jul. 10, 2009 Chinese Office Action in Chinese Application No. 2005800183590, with translation.
Nov. 24, 2009 Japanese Office Action in Japanese Application No. 2006-509667, with translation.
Mar. 2, 2010 Japanese Office Action in Japanese Application No. 2006-509667, with translation.
Nov. 20, 2009 Chinese Notice of Allowance in Chinese Application No. 200480009691.6, with translation.
Sep. 16, 2005 International Search Report and Written Opinion in Application No. PCT/US04/10309.
Aug. 13, 2009 European Search Report in European Application No. 04734624.2.
Oct. 4, 2005 International Search Report in Application No. PCT/JP2005/011305.
Dec. 10, 2009 Office Action in U.S. Appl. No. 11/630,110.
Aug. 12, 2009 Office Action in U.S. Appl. No. 11/822,964.
Nov. 7, 2008 Office Action in U.S. Appl. No. 11/822,964.
Dec. 5, 2007 Office Action in U.S. Appl. No. 11/822,964.
Mar. 23, 2010 Office Action in U.S. Appl. No. 11/630,110.
U.S. Appl. No. 12/656,456, filed Jan. 29, 2010.
Apr. 16, 2007 Search Report in European Application No. EP 04 75 9103.7.
Feb. 3, 2010 Office Action in European Application No. EP 04 734 624.2.
Sep. 23, 2010 Office Action in U.S. Appl. No. 11/808,230.
Oct. 21, 2010 Office Action in U.S. Appl. No. 12/153,234.
Oct. 28, 2010 Office Action in U.S. Appl. No. 12/134,950.
Nov. 4, 2010 Office Action in U.S. Appl. No. 11/570,219.
Nov. 4, 2010 Office Action in U.S. Appl. No. 11/767,441.
Nov. 5, 2010 Notice of Allowance in U.S. Appl. No. 11/808,231.
Nov. 9, 2010 Office Action in Taiwanese Application No. 093114406, with translation.
Dec. 14, 2010 Office Action in Japanese Application No. 2006-514514, with translation.
Mar. 25, 2011 Office Action in U.S. Appl. No. 12/003,038.
Mar. 25, 2011 Office Action in U.S. Appl. No. 12/379,171.
Mar. 25, 2011 Office Action in U.S. Appl. No. 12/382,075.
Mar. 25, 2011 Office Action in U.S. Appl. No. 12/382,162.
Jan. 20, 2011 Office Action in Chinese Appl. No. 201010113560.X, with translation.
Feb. 8, 2011 Office Action in Japanese Appl. No. 2006-274330, with translation.
Feb. 9, 2011 Office Action in Korean Appl. No. 2005-7019365, with translation.
Feb. 14, 2011 Office Action in Korean Appl. No. 2005-7022146, with translation.
Mar. 24, 2011 Notice of Allowance in U.S. Appl. No. 12/153,357.
Feb. 9, 2011 Office Action in Chinese Patent Application No. 201010127815.8, with translation.
May 18, 2011 Office Action in U.S. Appl. No. 11/603,078.
Apr. 20, 2011 Office Action in Chinese Patent Application No. 201010127802.0, with translation.
Jun. 6, 2011 Office Action in U.S. Appl. No. 12/134,950.
Jun. 10, 2011 Office Action in U.S. Appl. No. 11/570,219.
Jun. 10, 2011 Office Action in U.S. Appl. No. 11/767,441.
Jul. 8, 2011 Office Action issued in Korean Application No. 2007-7000539 (with English translation).
Jul. 21, 2011 Office Action issued in EP Application No. 09176909.1.
Jul. 21, 2011 Office Action issued in EP Application No. 09176910.9.
Jul. 21, 2011 Office Action issued in EP Application No. 09176911.7.
Jul. 21, 2011 Office Action issued in EP Application No. 09176912.5.
Jul. 26, 2011 Office Action issued in EP Application No. 09176913.3.
Oct. 24, 2011 Office Action issued in U.S. Appl. No. 12/003,038.
Oct. 24, 2011 Office Action issued in U.S. Appl. No. 12/379,171.
Oct. 24, 2011 Office Action issued in U.S. Appl. No. 12/382,162.
Oct. 25, 2011 Office Action issued in U.S. Appl. No. 12/382,078.

* cited by examiner

CLEANUP METHOD FOR OPTICS IN IMMERSION LITHOGRAPHY USING SONIC DEVICE

CROSS-REFERENCE TO RELATED APPLICATIONS

This is a Division of U.S. patent application Ser. No. 11/237,651 filed Sep. 29, 2005, which is a Continuation of International Application No. PCT/US2004/010309 filed Apr. 2, 2004, which claims the benefit of U.S. Provisional Patent Application No. 60/462,556 filed Apr. 11, 2003 and U.S. Provisional Patent Application No. 60/482,913 filed Jun. 27, 2003. The disclosures of these applications are hereby incorporated by reference herein in their entireties.

BACKGROUND

This invention relates to an immersion lithography system and more particularly to methods, as well as systems, for cleaning up the optical element that contacts and absorbs water in the process of immersion lithography.

Immersion lithography systems, such as disclosed in W099/49504, which is herein incorporated by reference for describing the general background of the technology as well as some general considerations related thereto, are adapted to supply a liquid into the space between a workpiece such as a wafer and the last-stage optical element of an optical system for projecting the image of a reticle onto the workpiece. The liquid thus supplied improves the performance of the optical system and the quality of the exposure.

The liquid to be supplied may be water for light with wavelength of 193 nm although different liquids may be necessary for light with other wavelengths. Because the last-stage optical element of the optical system is exposed to the liquid, there is a possibility that some of the liquid may be absorbed. This possibility is particularly high if the last-stage optical element of the optical system is a lens because calcium fluoride is a common lens material for lithography systems while it is a hygroscopic material that is capable of absorbing water from the surrounding environment.

The absorbed water may cause several problems. First, it may degrade the image projected by the lens by changing the refractive properties of the lens or by causing the lens to swell to thereby change the geometry of the lens. Second, it may cause long-term degradation of the lens due to chemical effects.

Conventional air-immersion exposure lithography systems require the optical elements to be made detachable for maintenance work such as when they are cleaned. It is a cumbersome and time-consuming operation, however, to remove an optical element and to reset it after it is cleaned or to exchange an optical element for a new one.

It is therefore an object of this invention to provide systems and methods for periodically removing the water from the lens such that the amount of absorbed water will not reach a critical level and the degradation of the image and the long-term damage to the lens can be prevented.

It is another object of the invention to provide systems and methods for making the maintenance of the optical element of an immersion lithography apparatus easier and thereby improve the useful lifetime of the optical element.

SUMMARY

Immersion lithography apparatus of this invention may include a reticle stage arranged to retain a reticle, a working stage arranged to retain a workpiece, an optical system including an illumination source and an optical element opposite the workpiece for projecting an image pattern of the reticle onto the workpiece by radiation from the illumination source while defining a gap between the optical element and the workpiece, and a fluid-supplying device for providing an immersion liquid between and contacting both the optical element and the workpiece during an immersion lithography process. The apparatus also includes a cleaning device to clean the optical element. The term "cleaning" will be used throughout this disclosure to mean both removing immersion liquid that has been absorbed into the optical element and removing dirt, debris, salts and the like from the optical element.

Many different kinds of cleaning devices may be used within the scope of this invention. For example, the cleaning device may use a cleaning liquid having affinity to the immersion liquid to be contacted with the optical element. If the immersion liquid is water, ethanol may serve as the cleaning liquid. As another example, the cleaning device may include a heat-generating device for heating the optical element and/or a vacuum device for generating a vacuum condition on the optical element.

Ultrasonic vibrations may be used for removing the absorbed liquid. An ultrasonic vibrator such as a piezoelectric transducer may be attached to the housing for the optical element or placed opposite the optical element such that the vibrations may be transmitted to the optical element through a liquid maintained in the gap.

Alternatively, cavitating bubbles may be used for the removal of the absorbed liquid. A pad with fins may be used to generate cavitating bubbles in a liquid maintained in the gap between the pad and the optical element.

According to another embodiment of the invention, the nozzles through which the immersion liquid is supplied into the gap between the workpiece and the optical element may be used to alternately supply a cleaning liquid by providing a flow route-switching device such as a switch valve.

With a system and method of this invention, the cleaning procedure becomes significantly easier and faster because there is no need to detach the optical element to be cleaned and the cleaning process improves the useful lifetime of the optical element.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
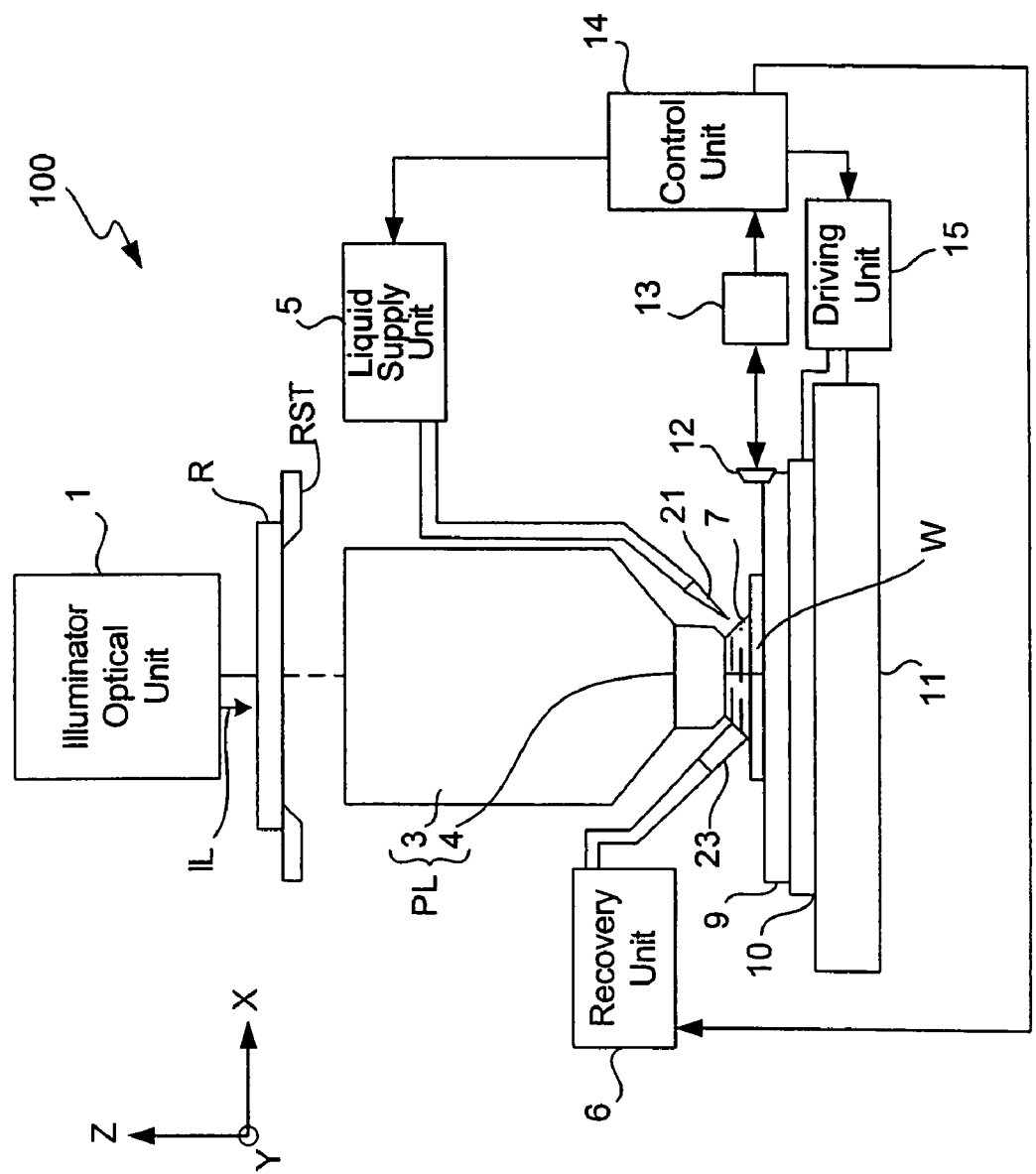
FIG. 1 is a schematic cross-sectional view of an immersion lithography apparatus to which methods and systems of this invention may be applied.

FIG. 1 shows an immersion lithography apparatus 100 to which cleaning methods and systems of this invention may be applied.

As shown in FIG. 1, the immersion lithography apparatus 100 comprises an illuminator optical unit 1 including a light source such as an excimer laser unit, an optical integrator (or homogenizer) and a lens and serving to emit pulsed ultraviolet light IL with wavelength 248 nm to be made incident to a pattern on a reticle R. The pattern on the reticle R is projected onto a wafer W coated with a photoresist at a specified magnification (such as ¼ or ⅕) through a telecentric light projection unit PL. The pulsed light IL may alternatively be ArF excimer laser light with wavelength 193 nm, $F_2$ laser light with wavelength 157 nm or the i-line of a mercury lamp with wavelength 365 nm. In what follows, the coordinate system with X-, Y- and Z-axes as shown in FIG. 1 is referenced to explain the directions in describing the structure and functions of the lithography apparatus 100. For the convenience of disclosure and description, the light projection unit PL is illustrated in FIG. 1 only by way of its last-stage optical element (such as a lens) 4 disposed opposite to the wafer W and a cylindrical housing 3 containing the rest of its components.

The reticle R is supported on a reticle stage RST incorporating a mechanism for moving the reticle R in the X-direction, the Y-direction and the rotary direction around the Z-axis. The two-dimensional position and orientation of the reticle R on the reticle stage RST are detected by a laser interferometer (not shown) in real time and the positioning of the reticle R is affected by a main control unit 14 on the basis of the detection thus made.

The wafer W is held by a wafer holder (not shown) on a Z-stage 9 for controlling the focusing position (along the Z-axis) and the tilting angle of the wafer W. The Z-stage 9 is affixed to an XY-stage 10 adapted to move in the XY-plane substantially parallel to the image-forming surface of the light projection unit PL. The XY-stage 10 is set on a base 11. Thus, the Z-stage 9 serves to match the wafer surface with the image surface of the light projection unit PL by adjusting the focusing position (along the Z-axis) and the tilting angle of the wafer W by the auto-focusing and auto-leveling method, and the XY-stage 10 serves to adjust the position of the wafer W in the X-direction and the Y-direction.

The two-dimensional position and orientation of the Z-stage 9 (and hence also of the wafer W) are monitored in real time by another laser interferometer 13 with reference to a mobile mirror 12 affixed to the Z-stage 9. Control data based on the results of this monitoring are transmitted from the main control unit 14 to a stage-driving unit 15 adapted to control the motions of the Z-stage 9 and the XY-stage 10 according to the received control data. At the time of an exposure, the projection light is made to sequentially move from one to another of different exposure positions on the wafer W according to the pattern on the reticle R in a step-and-repeat routine or in a step-and-scan routine.

The lithography apparatus 100 described with reference to FIG. 1 is an immersion lithography apparatus and is hence adapted to have a liquid (or the "immersion liquid") 7 of a specified kind such as water filling the space (the "gap") between the surface of the wafer W and the lower surface of the last-stage optical element 4 of the light projection unit PL at least while the pattern image of the reticle R is being projected onto the wafer W.

The last-stage optical element 4 of the light projection unit PL may be detachably affixed to the cylindrical housing 3 and is designed such that the liquid 7 will contact only the last-stage optical element 4 and not the cylindrical housing 3 because the housing 3 typically comprises a metallic material and is likely to become corroded.

The liquid 7 is supplied from a liquid supply unit 5 that may comprise a tank, a pressure pump and a temperature regulator (not individually shown) to the space above the wafer W under a temperature-regulated condition and is collected by a liquid recovery unit 6. The temperature of the liquid 7 is regulated to be approximately the same as the temperature inside the chamber in which the lithography apparatus 100 itself is disposed. Numeral 21 indicates supply nozzles through which the liquid 7 is supplied from the supply unit 5. Numeral 23 indicates recovery nozzles through which the liquid 7 is collected into the recovery unit 6. The structure described above with reference to FIG. 1 is not intended to limit the scope of the immersion lithography apparatus to which the cleaning methods and devices of the invention are applicable. In other words, the cleaning methods and devices of the invention are applicable to immersion lithography apparatus of many different kinds. In particular, the numbers and arrangements of the supply and recovery nozzles 21 and 23 around the light projection unit PL may be designed in a variety of ways for establishing a smooth flow and quick recovery of the immersion liquid 7.

Figure 4:
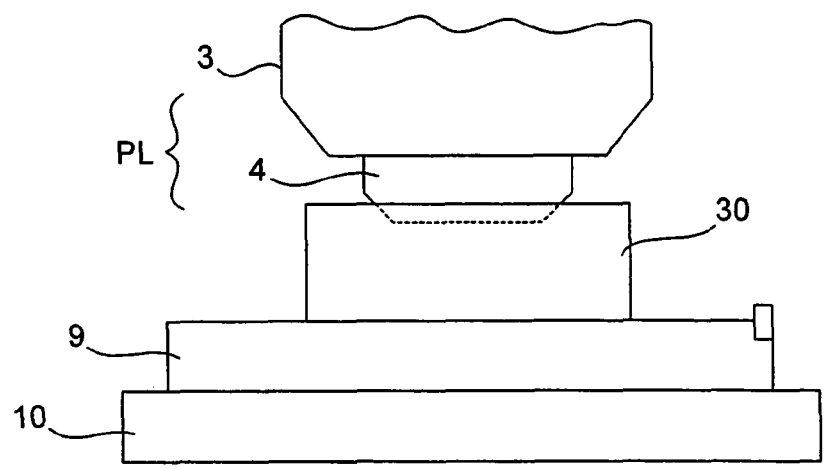
FIG. 4 is a schematic drawing showing a side view of a portion of the immersion lithography apparatus of FIG. 1.

A method embodying this invention of removing the portion of the liquid 7 such as water absorbed by the last-stage optical element 4 made of a hygroscopic material, as well as dirt, debris, etc., is explained next with reference to FIGS. 1 and 4. After the wafer W is exposed with light from the illuminator optical unit 1 through the light projection unit PL in the presence of the liquid 7 as shown in FIG. 1, the liquid 7 is removed from underneath the light projection unit PL and a cleaning device 30 is brought into contact with the last-stage optical element 4 as shown in FIG. 4. In the case of a portable kind, as shown in FIG. 4, the cleaning device 30 may be placed on the Z-stage 9 or the aforementioned wafer holder thereon, as shown in FIG. 4, in place of the wafer W.

Different types and kinds of cleaning devices 30 can be used for the purpose of this invention. As a first example, the cleaning device 30 may be a container containing a liquid ("cleaning liquid") having a strong affinity to the immersion liquid 7 that is absorbed by the optical element 4. If the immersion liquid 7 is water, the cleaning device 30 may contain ethanol because ethanol has a strong affinity to water. Any cleaning liquid may be used provided it has a sufficiently strong affinity to the liquid to be removed and does not damage the optical element 4 or its coating. The bottom surface of the optical element 4 is soaked in the cleaning liquid for a period of time sufficiently long to reduce the level of the absorbed immersion liquid. The cleaning device 30 is removed thereafter and the optical element 4 is ready to be exposed to the liquid 7 again.

As another example, the cleaning device 30 may contain a heat-generating device and/or a vacuum device (not separately shown). The combination of heat and vacuum on the surface of the optical element 4 causes the absorbed liquid to undergo a phase change into vapor, or to evaporate from the surface. The reduction in liquid density on the surface of the optical element 4 draws the liquid 7 that is absorbed more deeply in the element 4 to the surface of the optical element 4.

Figure 5:
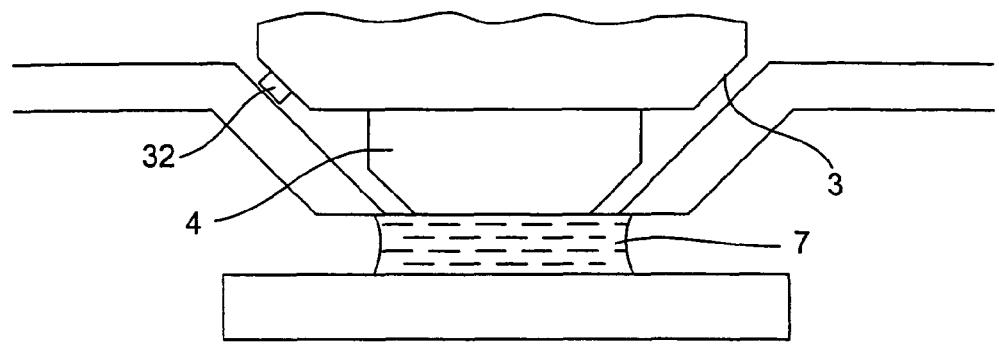
FIG. 5 is a schematic side view of a portion of another immersion lithography apparatus having an ultrasonic transducer attached so as to serve as its cleaning device.

FIG. 5 shows a third example in which use is made of an ultrasonic transducer (or ultrasonic vibrator) 32 attached to the housing 3 of the light projection unit PL. As the ultrasonic transducer 32 (such as a piezoelectric transducer) is activated, pressure waves are generated and propagated, serving to clean the surface of the optical element 4.

During the cleaning operation in FIG. 5, the gap adjacent to the optical element 4 is filled with the immersion liquid 7. In this case, the supply and recovery nozzles can continue to supply and collect the immersion liquid 7, or the supply and recovery nozzles can stop supplying and collecting the immersion liquid 7. Also during the cleaning operation, the optical element 4 can face a surface of wafer W, a surface of the Z-stage 9, or a surface of another assembly.

Figure 6:
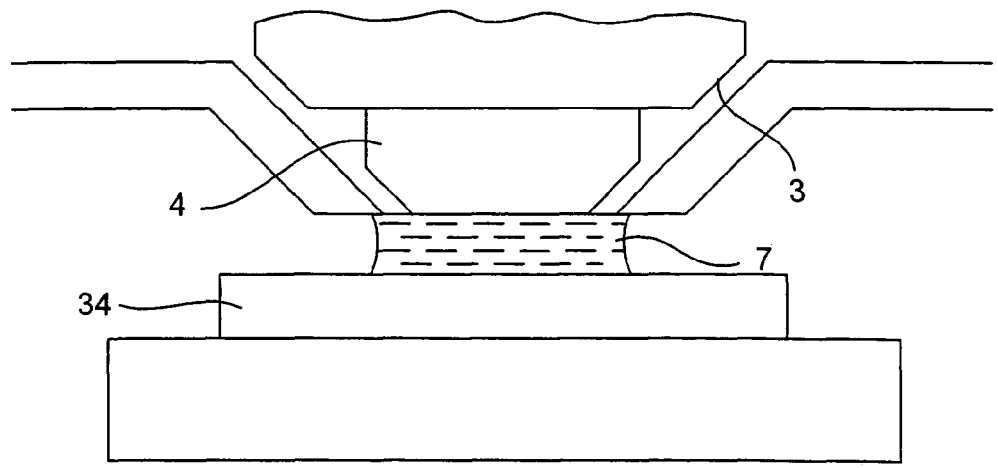
FIG. 6 is a schematic side view of a portion of another immersion lithography apparatus having a piezoelectric cleaning device below its optical system.

FIG. 6 is a fourth example using a vibratory tool 34 placed below the optical element 4 to be cleaned. The tool 34 may be shaped like the wafer W with thickness more or less equal to that of the wafer W, or about 0.5-1 mm, and may be made entirely of a piezoelectric material such that its thickness will fluctuate when activated. As the tool 34 is placed below the optical element 4, like the wafer W as shown in FIG. 1, and the gap between the optical element 4 and the tool 34 is filled with the liquid 7, pressure waves are generated in the immersion liquid 7 to clean the optical element.

During the cleaning operation of FIG. 6, the gap adjacent to the optical element 4 is filled with the immersion liquid 7. In this case, the supply and recovery nozzles can continue to supply and collect the immersion liquid 7, or the supply and recovery nozzles can stop supplying and collecting the immersion liquid 7. In another example, the vibrator tool 34 may be a ultrasonic transducer attached to the wafer holder on a Z-stage 9, or another assembly.

Figure 7:
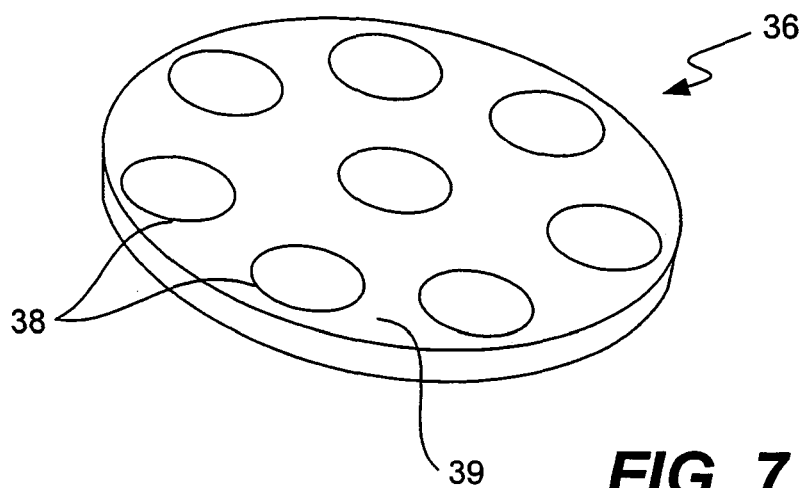
FIG. 7 is a schematic diagonal view of an example of a piezoelectric device.

FIG. 7 shows another tool 36, structured alternatively, having a plurality of piezoelectric transducers 38 supported by a planar supporting member 39.

Figure 8:
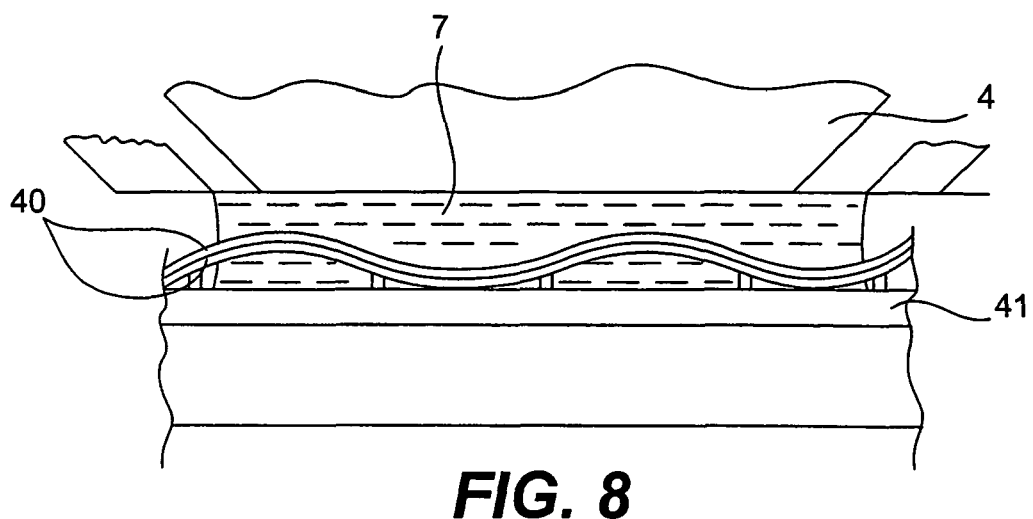
FIG. 8 is a schematic side view of a portion of another immersion lithography apparatus having two mutually attached piezoelectric planar members as the cleaning device.

FIG. 8 shows still another example of a cleaning device having two planar members 40 of a piezoelectric material attached in a face-to-face relationship and adapted to oscillate parallel to each other and out of phase by 180° with respect to each other. As a result, these members 40, attached to each other, will vibrate in the transverse directions, as shown in FIG. 8 in a very exaggerated manner. The vibration has node points at constant intervals where the members 40 are not displaced. The members 40 are supported at these node points on a supporting member 41. As voltages are applied to these members 40 so as to cause the vibrations in the mode described above, ultrasonic pressure waves are thereby generated and propagated through the liquid 7, and the optical element 4 is cleaned, as desired.

Figure 9:
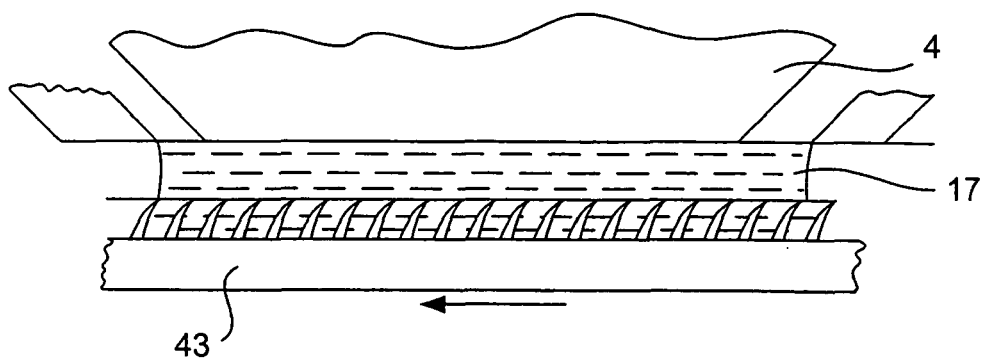
FIG. 9 is a schematic side view of a portion of another immersion lithography apparatus having a bubble-generating pad as the cleaning device.

FIG. 9 shows still another example of a cleaning device that cleans the optical element 4 by creating cavitating bubbles. Cavitating bubbles trapped and energized by ultrasound are high-temperature, high-pressure microreactors and intense energy released by the implosive compression of the bubbles is believed to rip molecules apart. The example shown in FIG. 9 is characterized as comprising a pad 43 with fins protruding upward and rapidly moved horizontally as shown by an arrow below the optical element 4 with a bubble-generating liquid 17 filling the gap in between (structure for moving the pad 43 not being shown). As the pad 43 is thus moved, the fins serve to stir the liquid 17 and to generate cavitating bubbles that in turn serve to clean the optical element.

Figure 10:
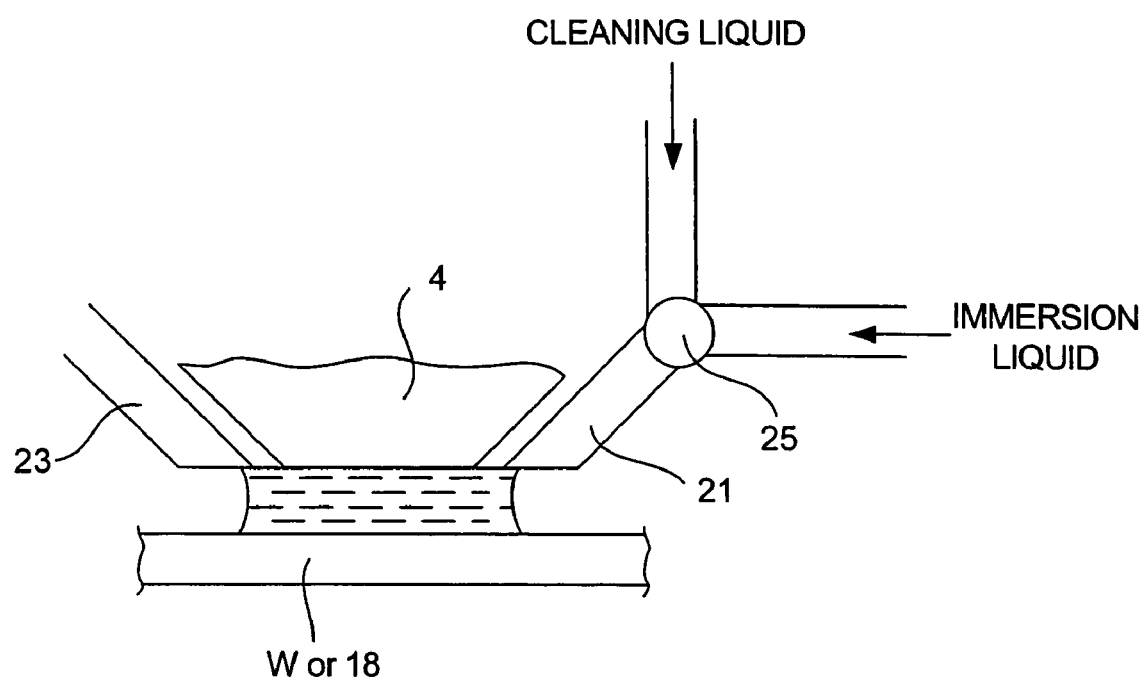
FIG. 10 is a schematic side view of a portion of another immersion lithography apparatus having a switching device incorporated in the fluid-supplying device.

FIG. 10 shows a different approach to the problem of cleaning the last-stage optical element 4 by applying a cleaning liquid on its bottom surface by using the same source nozzles 21 used for supplying the immersion liquid 7. For this purpose, a switch valve 25 is inserted between the supply nozzle 21 and the liquid unit 5 such that the immersion liquid 7 and the cleaning liquid can be supplied selectively through the supply nozzle 21.

It is again noted that the cleaning methods and systems according to this invention are applicable to immersion lithography apparatus of different kinds and types, for example, having different numbers of source nozzles. A switch valve as described above need not necessarily be provided to each of the source nozzles but may be provided to a group of the source nozzles.

The wafer W itself or a pad 18 of a suitable kind may be placed below the optical element 4 to provide a suitable gap in between when the cleaning liquid is thus supplied through the supply nozzles 21. This embodiment of the invention is advantageous because the same nozzles already present for supplying the immersion liquid can be utilized for the cleaning process.

Although various methods have been separately described above, they may be used in combinations, although that is not separately illustrated in the drawings. For example, the pad 43 with fins shown in FIG. 9 may be used instead of the pad 18 of FIG. 10. In other words, the examples described above are not intended to limit the scope of the invention, and many modifications and variations are possible within the scope of this invention. For example, a polishing pad similar to one used in chemical mechanical polishing may be used for this purpose. The cleanup procedure shown in FIGS. 4-10 may be carried out with ultraviolet light. The light may irradiate the optical element 4. The light may be normal exposure light from the illuminator optical unit 1 or some other light of an appropriate wavelength for the purpose of the cleanup. In another example, the ultraviolet light for the purpose of the cleanup may be used without the cleanup procedure shown in FIGS. 4-10, and may be used under a condition in which the gap adjacent to the optical element 4 is filled with the immersion liquid 7 from the liquid supply unit 5. All such modifications and variations that may be apparent to a person skilled in the art are intended to be within the scope of this invention.

Any of the above described cleaning methods for removing immersion fluid absorbed by the last-stage optical element also may be used to remove salts, deposits, dirt and debris that may have accumulated. The term cleaning therefore refers to both of these phenomena.

Figure 2:
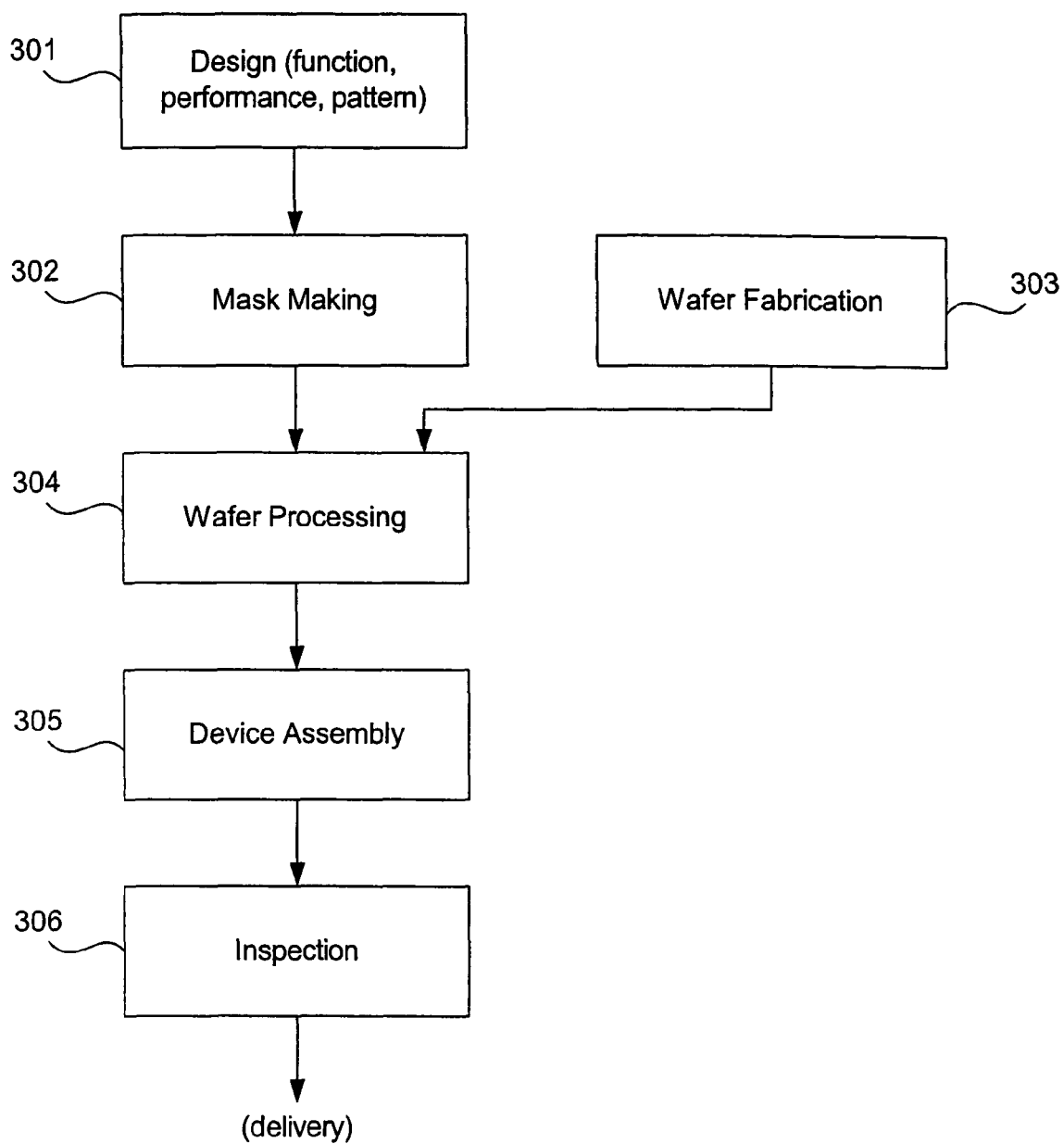
FIG. 2 is a process flow diagram illustrating an exemplary process by which semiconductor devices are fabricated using the apparatus shown in FIG. 1 according to the invention.

FIG. 2 is referenced next to describe a process for fabricating a semiconductor device by using an immersion lithography apparatus incorporating a cleaning device embodying this invention. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
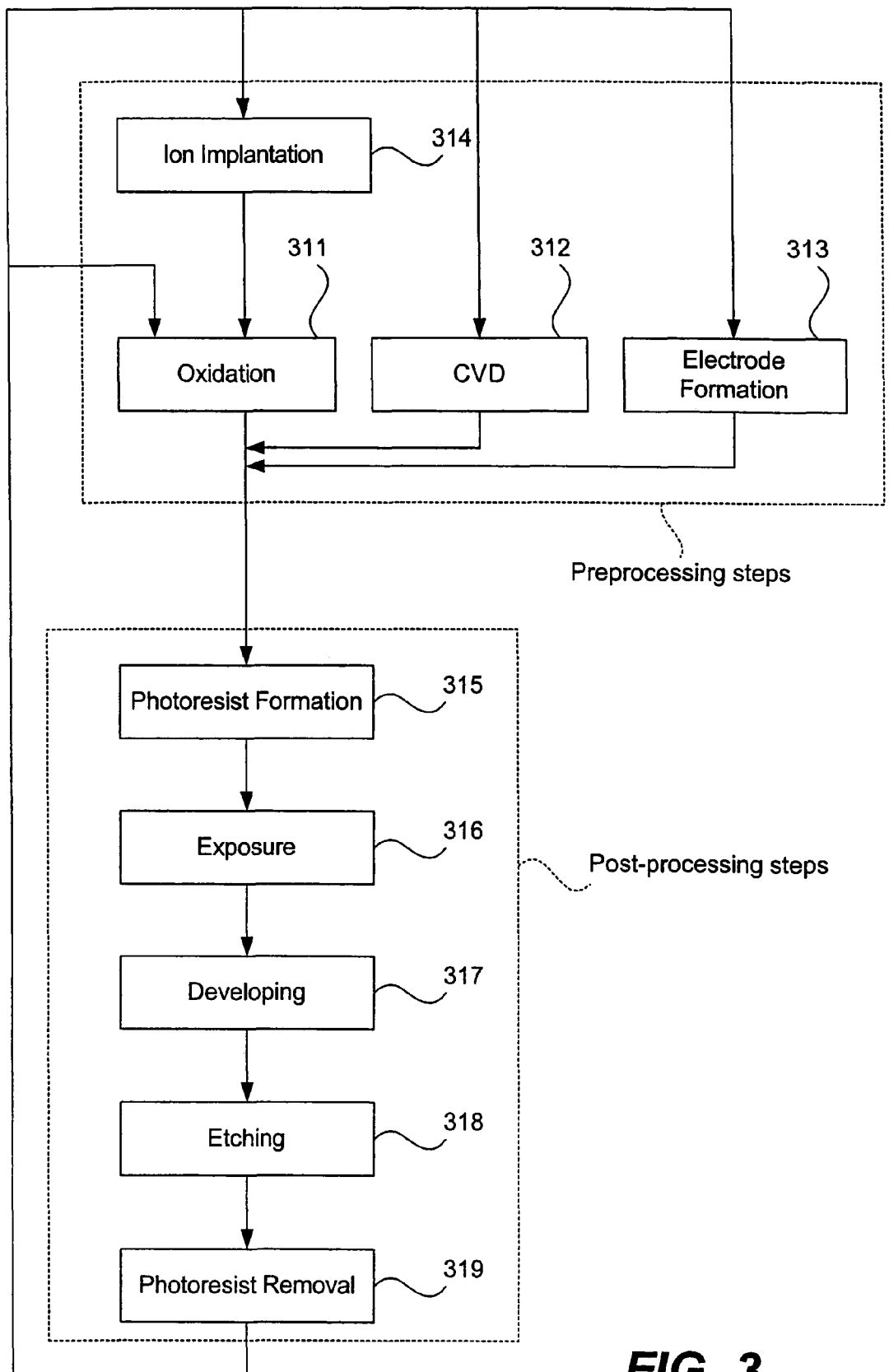
FIG. 3 is a flowchart of the wafer processing step shown in FIG. 2 in the case of fabricating semiconductor devices according to the invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The aforementioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316 (exposure step), the above-mentioned exposure device is used to transfer the circuit pattern of a mask (reticle) onto a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While a lithography system of this invention has been described in terms of several preferred embodiments, there are alterations, permutations, and various substitute equivalents which fall within the scope of this invention. There are many alternative ways of implementing the methods and apparatus of the invention.

What is claimed is:

1. A method used in a liquid immersion lithography apparatus, the method comprising:
   exposing a substrate by projecting an image onto the substrate through an exposure liquid in an exposure operation; and
   generating pressure waves in a cleaning liquid between a member of the lithography apparatus and a movable component of the lithography apparatus which is movable below the member, by using a transducer disposed above the movable component, to remove a contaminant from the member in a cleaning operation in which the substrate is not in contact with the cleaning liquid, wherein
   the transducer is mounted apart from the movable component and does not move with the movable component, and
   the substrate is moved below the member in the exposure operation and the member does not face the substrate in the cleaning operation.

2. The method according to claim 1, wherein the cleaning liquid includes the exposure liquid.

3. The method according to claim 1, wherein the member includes an optical element of an optical system by which the image is projected onto the substrate in the exposure operation.

4. The method according to claim 1, wherein the substrate is held on a substrate holding portion of the movable component in the exposure operation.

5. The method according to claim 4, wherein the movable component is for controlling a focus position and a tilting angle of the substrate in the exposure operation.

6. The method according to claim 4, wherein the movable component includes a stage.

7. The method according to claim 1, wherein the contaminant includes debris.

8. The method according to claim 1, wherein the contaminant includes dirt.

9. The method according to claim 1, further comprising irradiating the member with ultraviolet light in the cleaning operation.

10. The method according to claim 1, wherein the transducer includes a piezoelectric transducer.

11. The method according to claim 1, wherein the member is in contact with the exposure liquid in the exposure operation.

12. The method according to claim 11, wherein the exposure liquid covers only a portion of a surface of the substrate in the exposure operation.

13. The method according to claim 12, wherein the exposure liquid is retained between the member and the substrate in the exposure operation.

14. The method according to claim 13, wherein the member includes an optical element of an optical system by which the image is projected onto the substrate in the exposure operation.

15. The method according to claim 14, wherein the transducer is attached to a housing of the optical system.

16. The method according to claim 1, wherein the exposure liquid is supplied from an inlet onto the substrate in the exposure operation in which the substrate is moved below the inlet and the movable component is movable below the inlet.

17. The method according to claim 1, wherein the cleaning liquid is supplied from an inlet disposed above the movable component.

* * * * *